United States Patent
Ukegawa et al.

(10) Patent No.: US 10,206,310 B2
(45) Date of Patent: Feb. 12, 2019

(54) ELECTRONICS ASSEMBLIES INCORPORATING THREE-DIMENSIONAL HEAT FLOW STRUCTURES

(71) Applicant: Toyota Motor Engineering & Manufacturing North America, Inc., Erlanger, KY (US)

(72) Inventors: Hiroshi Ukegawa, Northville, MI (US); Yanghe Liu, Ann Arbor, MI (US); Feng Zhou, South Lyon, MI (US); Shailesh N. Joshi, Ann Arbor, MI (US); Ercan Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 15/481,821

(22) Filed: Apr. 7, 2017

(65) Prior Publication Data

US 2018/0295748 A1  Oct. 11, 2018

(51) Int. Cl.
*H05K 7/20* (2006.01)
*H01L 23/367* (2006.01)
(Continued)

(52) U.S. Cl.
CPC ....... *H05K 7/20509* (2013.01); *H01L 23/367* (2013.01); *H01L 23/3733* (2013.01);
(Continued)

(58) Field of Classification Search
CPC ....... H05K 7/20254–7/20263; H05K 7/20309; H05K 7/20927–7/20936; H05K 1/0201–1/0203
See application file for complete search history.

(56) References Cited

U.S. PATENT DOCUMENTS 4,867,235 A * 9/1989 Grapes ................ H01L 23/3733
165/185
4,964,457 A * 10/1990 Leonard ................ F28D 15/046
165/104.26
(Continued)

OTHER PUBLICATIONS

Dede et al., Thermal-composite design optimization for heat flux shielding, focusing, and reversal, Structural and Multidisciplinary Optimization, 49(1), pp. 59-68, Jan. 2014.
(Continued)

*Primary Examiner* — Robert J Hoffberg
(74) *Attorney, Agent, or Firm* — Dinsmore & Shohl LLP

(57) ABSTRACT

Electronics assemblies incorporating three-dimensional heat flow structures are disclosed herein. In one embodiment, an electronics assembly includes a substrate having a surface defining a plane, a heat generating component coupled to the surface of the substrate, a cooling device positioned outside of the plane defined by the surface of the substrate, and a three-dimensional heat flow structure. The three-dimensional heat flow structure includes a first portion thermally coupled to the heat generating component and a second portion extending from the first portion. At least a portion of the first portion is parallel to the plane defined by the substrate. The second portion is transverse to the plane defined by the surface of the substrate. The second portion is thermally coupled to the cooling device such that the three-dimensional heat flow structure thermally couples the heat generating component to the cooling device.

18 Claims, 12 Drawing Sheets

(51) Int. Cl.
 *H01L 23/373* (2006.01)
 *H01L 23/473* (2006.01)

(52) U.S. Cl.
 CPC ......... *H05K 7/209* (2013.01); *H05K 7/20254* (2013.01); *H01L 23/473* (2013.01); *H05K 7/20927* (2013.01)

(56) References Cited

U.S. PATENT DOCUMENTS

| | | | |
|---|---|---|---|
| 5,101,560 A * | 4/1992 | Leonard | F28D 15/046 165/104.26 |
| 5,343,940 A * | 9/1994 | Jean | F28D 15/0241 165/104.33 |
| 6,257,328 B1 * | 7/2001 | Fujiwara | F28F 13/00 165/185 |
| 6,657,121 B2 * | 12/2003 | Garner | H05K 7/20681 174/16.3 |
| 6,758,263 B2 | 7/2004 | Krassowski et al. | |
| 6,799,282 B2 | 9/2004 | Maeda et al. | |
| 6,914,780 B1 * | 7/2005 | Shanker | F28D 15/0233 165/104.33 |
| 6,972,365 B2 * | 12/2005 | Garner | H05K 7/20681 174/16.3 |
| 7,108,055 B2 | 9/2006 | Krassowski et al. | |
| 7,391,616 B2 * | 6/2008 | Kim | H05K 1/0204 165/80.3 |
| 7,474,527 B2 * | 1/2009 | Wu | G06F 1/20 165/104.33 |
| 7,486,517 B2 | 2/2009 | Aapro et al. | |
| 7,663,883 B2 * | 2/2010 | Shirakami | H01L 23/373 165/46 |
| 8,861,203 B2 * | 10/2014 | Fang | G06F 1/20 165/185 |
| 8,879,261 B2 * | 11/2014 | Lee | F28D 15/0275 165/104.21 |
| 9,545,030 B2 * | 1/2017 | Nikkhoo | H05K 7/20127 |
| 9,700,968 B2 * | 7/2017 | Kenna | B23P 15/26 |
| 2003/0173060 A1 | 9/2003 | Krassowski et al. | |
| 2004/0136162 A1 * | 7/2004 | Asai | H05K 1/0207 361/715 |
| 2007/0062676 A1 | 3/2007 | Yao | |
| 2011/0186720 A1 | 8/2011 | Jongen et al. | |
| 2014/0284039 A1 | 9/2014 | Dede et al. | |
| 2014/0318758 A1 | 10/2014 | Dede et al. | |
| 2014/0318829 A1 | 10/2014 | Dede et al. | |
| 2015/0301568 A1 | 10/2015 | Hill et al. | |
| 2016/0025430 A1 | 1/2016 | Dede et al. | |
| 2016/0029518 A1 | 1/2016 | Dede et al. | |

OTHER PUBLICATIONS

Dede, Simulation and optimization of heat flow via anisotropic material thermal conductivity, Computational Materials Science, 50 (2010) 510-515.

Dede et al., Heat flux cloaking, focusing, and reversal in ultra-thin composites considering conduction-convection effects, Applied Physics Letter, 103(6), Aug. 2013.

* cited by examiner

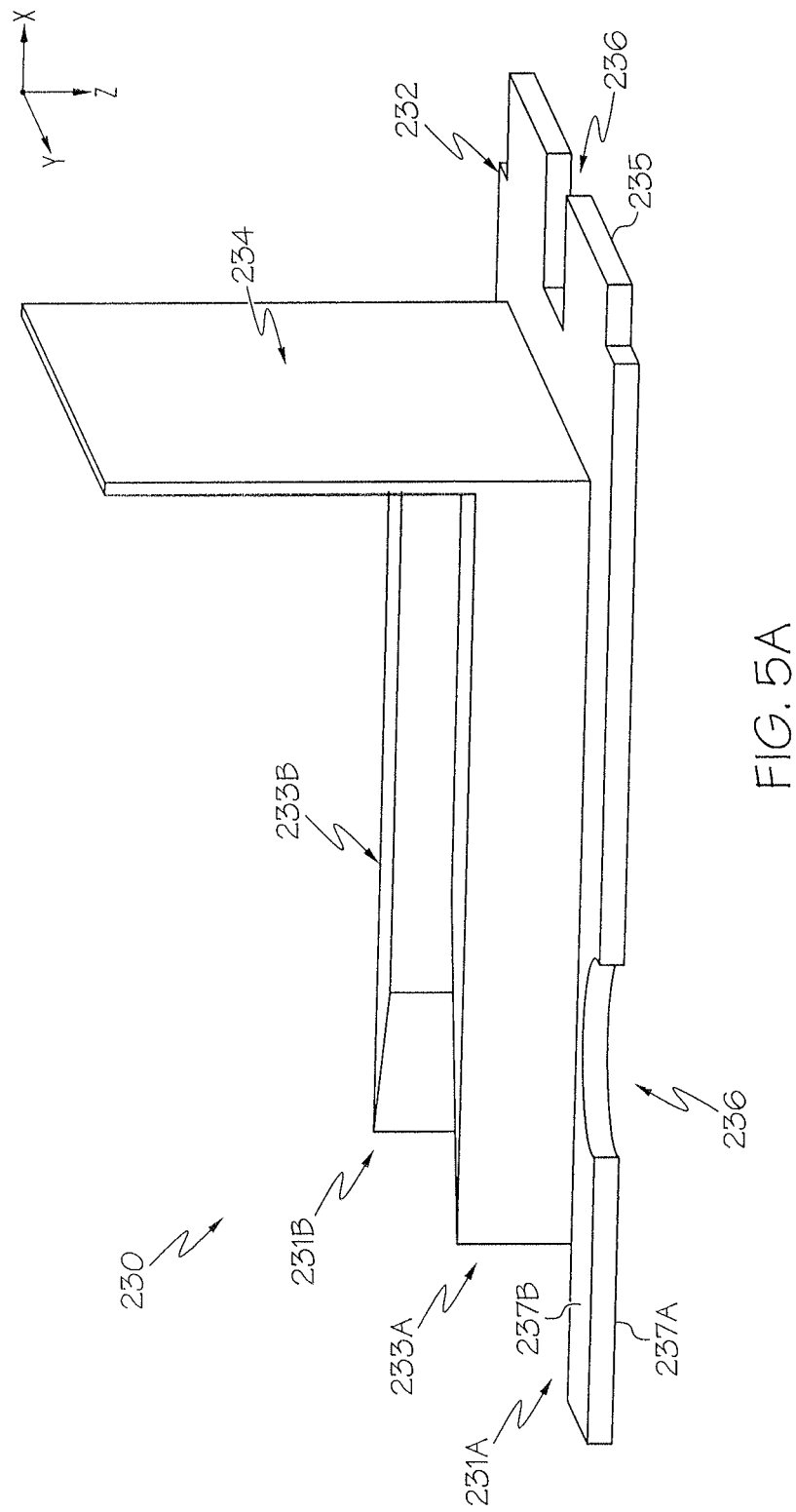

ELECTRONICS ASSEMBLIES INCORPORATING THREE-DIMENSIONAL HEAT FLOW STRUCTURES

TECHNICAL FIELD

Embodiments described herein generally relate to electronics assemblies, and more particularly, to electronics assemblies incorporating three-dimensional heat flow structures.

BACKGROUND

Electronics assemblies may include components that generate heat flux that should be removed to ensure that the components operate below their maximum operating temperature. Some electronics assemblies may utilize a cooling device, such as a heat sink or an active cooling device, such as a liquid-based cooling device. In one example, power switching devices, such as insulated-gate bipolar transistors utilized in inverter circuits, may generate significant heat that should be removed. These power switching devices may be directly coupled to a cooling device. However, other components within the electronics assembly located away from the cooling device may also generate heat flux that should be removed. Adding additional cooling devices may increase the cost and size of the electronics assembly. As an example, gate-drive integrated circuits operable to control power switching devices may also generate significant heat flux that should be removed.

Accordingly, alternative electronics assemblies capable of cooling heat generating devices located away from a cooling device in three-dimensional space are desired.

SUMMARY

In one embodiment, an electronics assembly includes a substrate having a surface defining a plane, a heat generating component coupled to the surface of the substrate, a cooling device positioned outside of the plane defined by the surface of the substrate, and a three-dimensional heat flow structure. The three-dimensional heat flow structure includes a first portion thermally coupled to the heat generating component and a second portion extending from the first portion. At least a portion of the first portion is parallel to the plane defined by the substrate. The second portion is transverse to the plane defined by the surface of the substrate. The second portion is thermally coupled to the cooling device such that the three-dimensional heat flow structure thermally couples the heat generating component to the cooling device.

In another embodiment, an electronics assembly includes a housing defining an enclosure and including a component surface, the component surface having an opening, and a substrate having a surface defining a plane, wherein the surface of the substrate faces the component surface of the housing. The electronics assembly further includes a heat generating component coupled to the surface of the substrate, a cooling device positioned outside of the plane defined by the surface of the substrate and disposed within the enclosure, and a three-dimensional heat flow structure. The three-dimensional heat flow structure includes a first portion thermally coupled to the heat generating component and a second portion extending from the first portion. The first portion includes a convergence region, a first arm extending from the convergence region, and a second arm extending from the convergence region. The convergence region, the first arm, and the second arm are planar and parallel to the plane defined by the surface of the substrate. The second portion is transverse to the first portion and extends through the opening of the component surface of the housing. The second portion is thermally coupled to the cooling device such that the three-dimensional heat flow structure thermally couples the heat generating component to the cooling device.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which:

FIGS. 5A and 5B schematically depict alternative perspective views of an example three-dimensional heat flow structure operable to be disposed in the electronics assembly of FIG. 2 according to one or more embodiments described and illustrated herein;

DETAILED DESCRIPTION

Embodiments disclosed herein are directed to electronics assemblies including three-dimensional heat flow structures that thermally couple one or more heat generating components, such as electronic heat generating components, to a cooling device through three-dimensional space. Thus, embodiments provide a three-dimensional heat flow path from a heat generating component to a cooling device. In one non-limiting example, heat generating components may be coupled to a circuit board. A cooling device, such as a liquid cooling device, may be spaced apart from, and located above or below, the circuit board. One or more three-dimensional heat flow structures may be thermally coupled to the heat generating components on the circuit board and the cooling device, thereby thermally coupling the heat generating components to the cooling device through three-dimensional space. In this manner, multiple heat generating components in various planes and location in three-dimensional space may be thermally coupled to a cooling device.

In another non-limiting example, first heat generating devices are configured as gate-drive integrated circuits operable to control second heat generating devices configured as switching power devices of an inverter circuit that are cooled by a liquid cooling device. The gate-drive integrated circuits are disposed on a surface of a circuit board that is located above the cooling device. The gate-drive integrated circuits may generate heat that should be removed to maintain them at a temperature below their maximum operating temperature. A three-dimensional heat flow structure may thermally couple the gate-drive integrated circuits to the cooling device used to cool the power switching devices. Thus, heat flux may be removed from the gate-drive integrated circuits without adding additional cooling components.

Various embodiments of electronic assemblies comprising a three-dimensional heat flow structures are described in more detail below.

Figure 1:
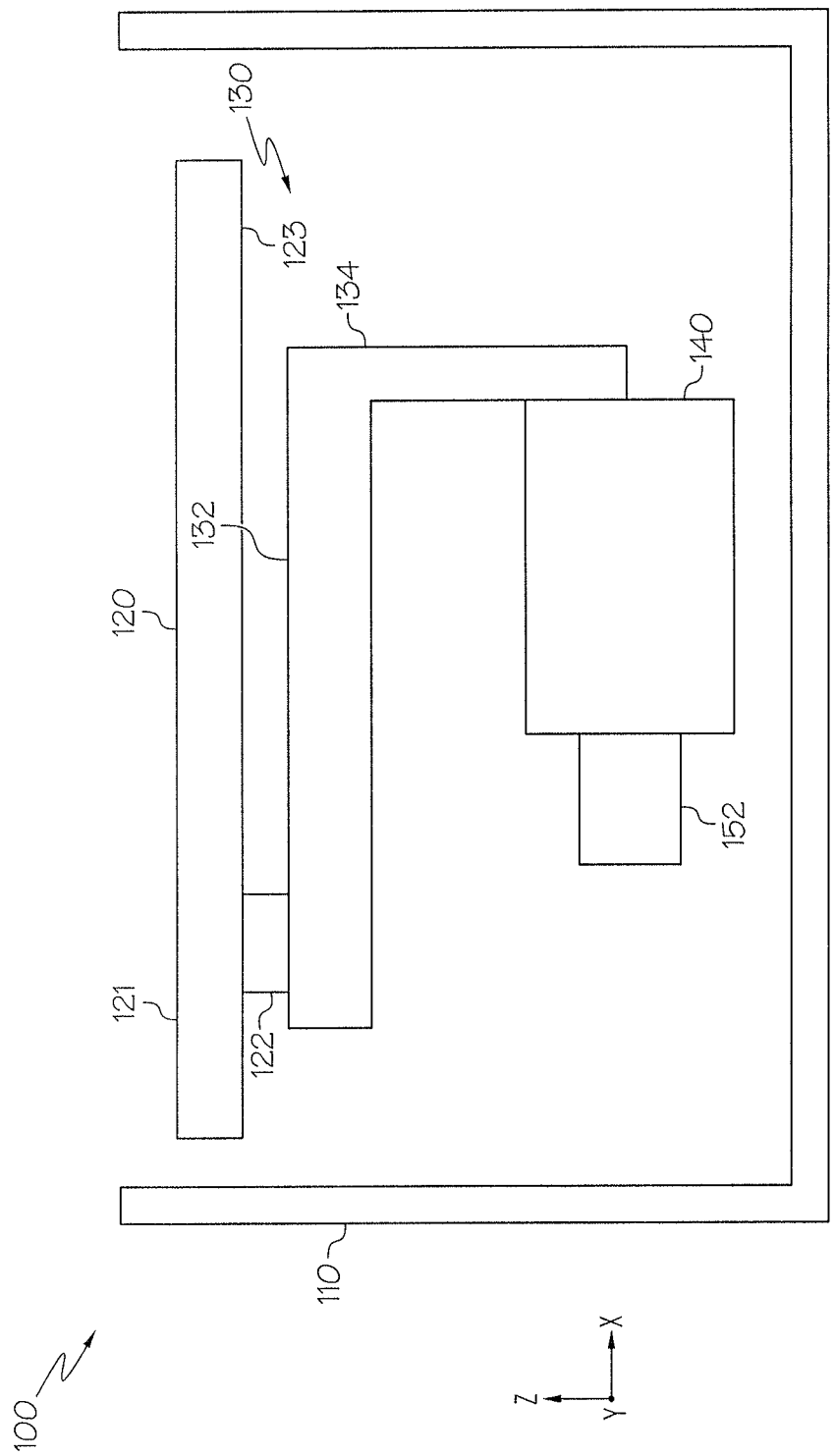
FIG. 1 schematically depicts an example electronics assembly including a three-dimensional heat flow structure according to one or more embodiments described and illustrated herein.

Referring now to FIG. 1, an example electronics assembly 100 is schematically illustrated. The example electronics assembly 100 generally comprises a substrate 120 having a surface 123, a heat generating component 122 coupled to the surface 123 of the substrate 120, a three-dimensional heat flow structure 130, and a cooling device 140. The example electronics assembly 100 may also include a housing 110 and a second heat generating component 152 that is coupled to the cooling device 140 in some embodiments.

As an example and not a limitation, the substrate 120 may be configured as a circuit board. The substrate 120 may be made out of any suitable material, such as, without limitation, FR-4. The substrate 120 depicted in FIG. 1 has a surface 121 and a surface 123. Surface 121 may be considered an upper surface and surface 123 may be considered a lower surface, for example. Surface 123 of the substrate 120 defines a plane, such as a plane parallel to the x-axis.

Any number of components may be coupled to surface 121 and/or surface 123. FIG. 1 depicts a heat generating component 122 coupled to surface 123 of the substrate 120. The heat generating component 122 may be any component that generates heat. Example heat generating components include, but are not limited to, integrated circuit chips, resistors, switching devices, microcontrollers, processors, and the like. Any number of heat generating components 122 may be provided on the surface 123. In one particular non-limiting example, the heat generating component 122 is a gate-drive integrated circuit operable to control a switching power electronics device of an inverter circuit. As an example and not a limitation, the electronics assembly 100 may be an inverter power module operable to drive one or more electric motors of an electrified vehicle. As described in more detail below, operation of the heat generating component 122 may cause the heat generating component to generate heat that should be removed from the heat generating component 122 to ensure proper operation and prevent failure.

The cooling device 140 depicted in FIG. 1 may be configured as any cooling device capable of receiving and removing heat such as, without limitation, a heat sink, a jet-impingement cooling device, a two-phase cooling device, a cold finger, a Peltier cooler, and the like. As shown in FIG. 1, the cooling device 140 is located outside of the plane defined by surface 123 of the substrate 120. As such, the cooling device 140 is positioned below the surface 123 along the negative z-axis.

In embodiments, the cooling device 140 is operable to remove heat from one or more second heat generating components 152 that are coupled to the cooling device 140. In some embodiments, the second heat generating components 152 are directly coupled to the cooling device 140. The second heat generating component 152 is any component that generates heat. As an example, the second heat generating component 152 has a higher operating temperature than the heat generating component 122 coupled to the substrate 120, and thus generates more heat than the heat generating component 122. As a non-limiting example, the second heat generating component 152 is a power electronics switching device, such as, without limitation, a insulated-gate bipolar transistor (IGBT), a metal-oxide field-effect transistor (MOSFET), a silicon-coated rectifier (SCR), and a power transistor. The second heat generating component 152 may be controlled by the heat generating component in an inverter circuit, such as to switch DC voltage to generate AC voltage, for example.

The three-dimensional heat flow structure 130 thermally couples the heat generating component 122 coupled to the surface 123 of the substrate 120 to the cooling device 140. Because the cooling device 140 is located outside of the plane defined by the surface 123 of the substrate 120, and the heat generating component 122 is not directly coupled to the cooling device 140, the three-dimensional heat flow structure 130 has a three-dimensional shape. In the illustrated embodiment, the three-dimensional heat flow structure 130 has first portion 132 thermally coupled to the heat generating component 122 and a second portion 134 thermally coupled to the cooling device 140. It is noted that any two components described as being thermally coupled to one another may have a thermal paste disposed between the two thermally coupled components. At least a portion of the first portion 132 is parallel to the surface 123 of the substrate 120. The second portion 134 extends away from the surface 123 of the substrate 120 in a direction along the negative z-axis toward the cooling device 140. In the illustrated example, the three-dimensional heat flow structure 130 has an "L" shape in cross-section. Although FIG. 1 illustrates second portion 134 as being orthogonal to the first portion 132 and the surface 123, embodiments are not limited thereto.

The three-dimensional heat flow structure 130 may be made out of any suitable thermally conductive material such as, without limitation, copper, aluminum, gold, and thermally conductive polymers.

In one example, the first portion of the three-dimensional heat flow structure 130 may be indirectly coupled to the heat generating component 122 by one or more thermally conductive components (not shown) that are thermally conductive but electrically insulating. In this manner, the heat generating component 122 may be electrically isolated from the three-dimensional heat flow structure 130 while also allowing thermal transfer between the heat generating component 122 and the three-dimensional heat flow structure 130. As a non-limiting example of a thermal interface material, silicone rubber may be disposed between the heat generating component 122 and the three-dimensional heat flow structure 130.

Still referring to FIG. 1, the substrate 120, the heat generating component 122, the three-dimensional heat flow structure 130, and the cooling device 140 may be enclosed by a housing 110, thereby defining an electronics assembly or package. The housing may be made of any suitable material, such as metal or polymer.

Figure 2:
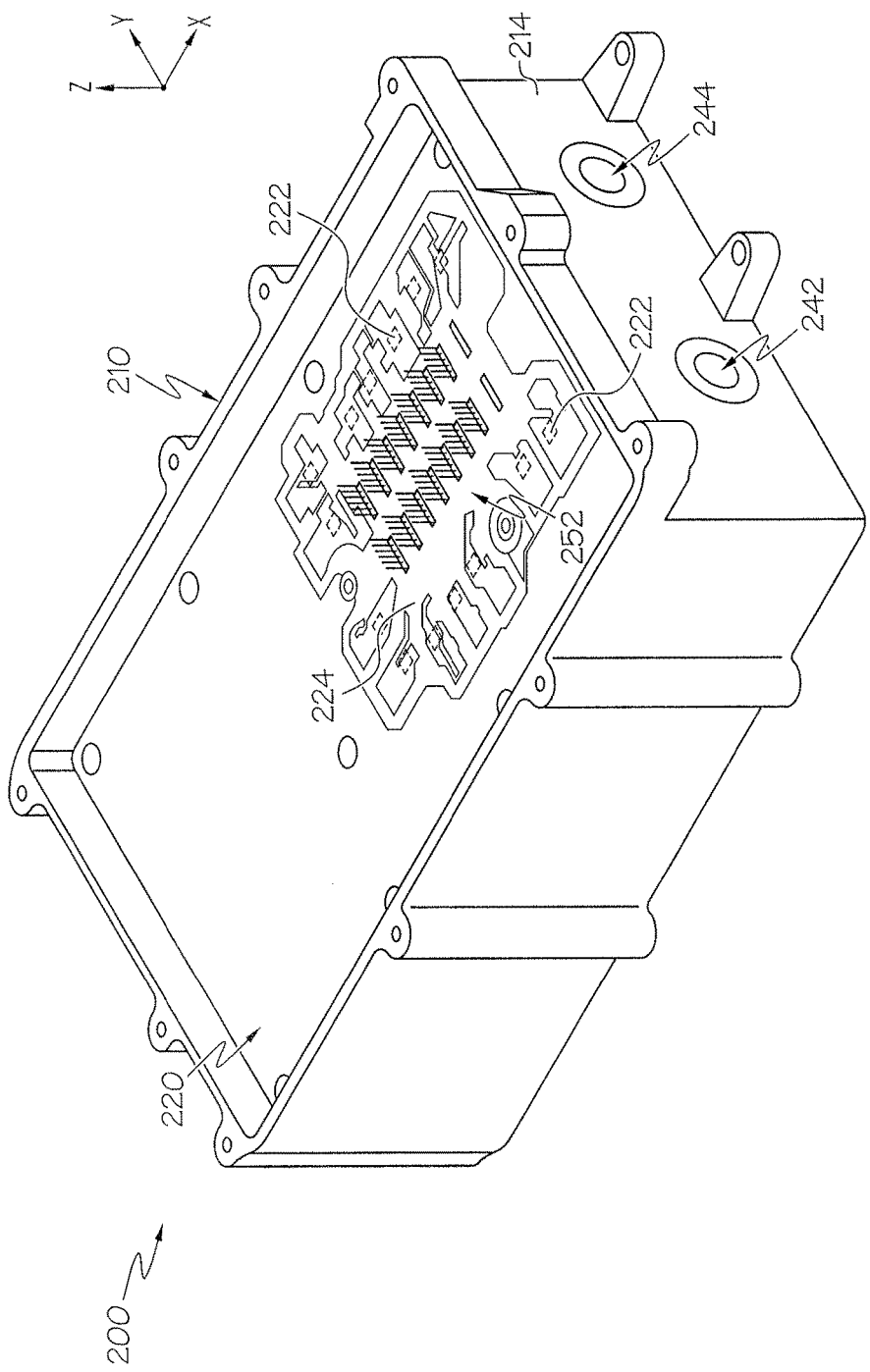
FIG. 2 schematically depicts another example electronics assembly including a three-dimensional heat flow structure according to one or more embodiments described and illustrated herein.
Figure 3:
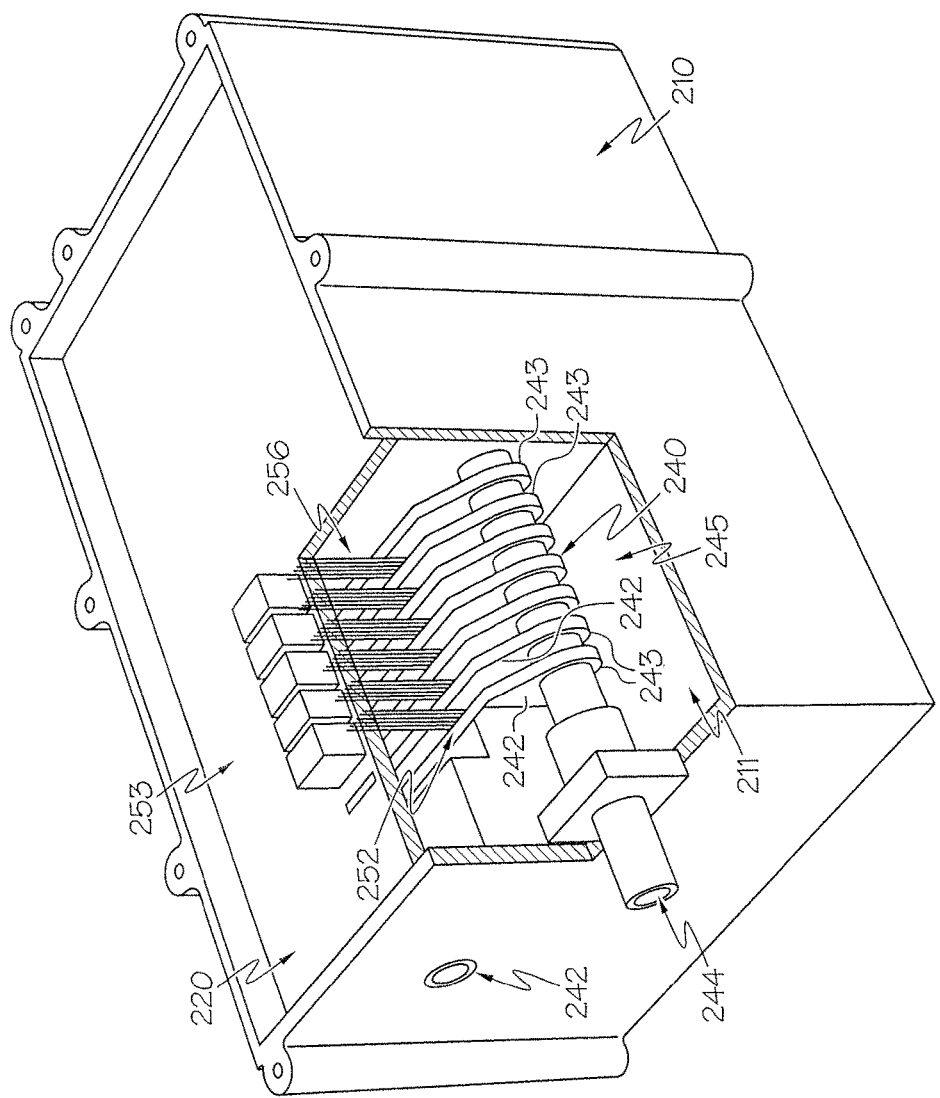
FIG. 3 schematically depicts a partial cutaway view of the example electronics assembly depicted in FIG. 2 according to one or more embodiments described and illustrated herein.

Referring now to FIGS. 2 and 3, another example of an electronics assembly 200 is schematically illustrated. As described in detail below, the electronics assembly 200 may be an inverter circuit operable to convert direct current into alternating current to drive a load, such as an electric motor of an electrified vehicle. In this application, a plurality of first heat generating devices 222 (i.e., a plurality of heat generating devices) is configured as a plurality of gate-drive integrated circuits that control (i.e., switch) a plurality of second heat generating devices 252 configured as a plurality of power switching devices (e.g., IGBTs, MOSFETS, and the like).

The example electronics assembly 200 generally includes a housing 210 defining an enclosure 211 and a substrate configured as a circuit board 220. FIG. 2 is a perspective view of an assembled electronics assembly 200, while FIG. 3 is a perspective view of the electronics assembly 200 depicted in FIG. 2 with a portion of the housing 210 and the circuit board 220 cut away to reveal internal components.

The housing 210 may be made of any suitable material. In some embodiments, the housing 210 may be made of a thermally conductive material to enable heat transfer from heat generating components within the enclosure to the environment or any external cooling structures or features. The housing 210 may be fabricated from one or more components, such as one or more plates. The housing 210 may be fabricated by any process, such as machining or molding, for example.

As described in more detail below, the example housing 210 encloses a cooling device 240 and at least one second heat generating device 252 (also see FIG. 10). The housing 210 includes a fluid inlet 242 and a fluid outlet 244 (e.g., in a wall 214) for introducing cooling fluid (e.g., water, refrigerant, oil and the like) into the cooling device 240 and exhausting warmed cooling fluid from the cooling device. In the illustrated embodiment, the cooling device 240 is configured as a two-phase cooling device in which a cooling fluid is introduced through the fluid inlet 242, is heated by a plurality of second heat generating devices 252, and exits as a liquid or vapor through the fluid outlet 244. The cooling device 240 may be configured as a single phase cooling device in other embodiments. The cooling device 240 may also be configured as a single-phase or two-phase jet impingement cooling device wherein jet of cooling fluid impinge a target surface heated by a second heat generating device. Non-limiting example cooling devices 240 are described in U.S. Pat. No. 9,437,523, which is hereby incorporated by reference in its entirety.

As shown in FIG. 3, the cooling device 240 and a plurality of second heat generating devices 252 define a power module 245 that is disposed within the enclosure 211 of the housing 210. The example cooling device 240 comprises a plurality of cold plates 243, each of which is configured to receive cooling fluid. The plurality of second heat generating devices 252 is interleaved between the plurality of cold plates 243 such that each second heat generating device 252 receives two-sided cooling.

Each second heat generating device 252 has at least one electrically conductive lead 256 extending out of the housing 210. The at least one electrically conductive lead 256 of each second heat generating component is electrically coupled to the circuit board 220 and may include, without limitation, a positive lead, a negative or ground lead, and a control signal lead. The at least one electrically conductive lead 256 may be electrically coupled to one or more first heat generating components 222 via electrically conductive traces or wires of the circuit board 220. In this manner, the plurality of first heat generating components 222 may control the switching of the second heat generating components 252 coupled to the cooling device 240.

Figure 4:
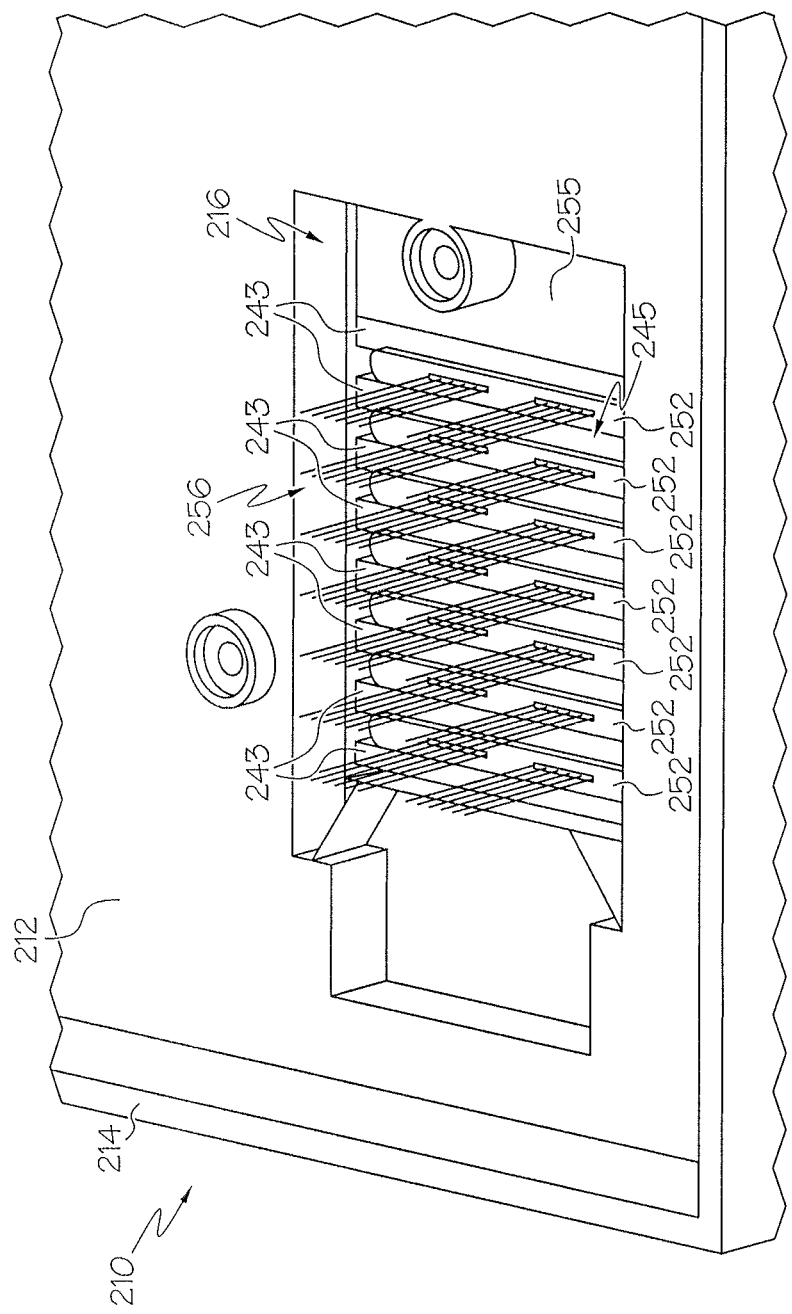
FIG. 4 schematically depicts a partial perspective view of the example electronics assembly of FIG. 2 with a circuit board and three-dimensional heat flow structure removed according to one or more embodiments described and illustrated herein.

Referring now to FIG. 4, a partial, top perspective view of the electronics assembly 200 is schematically illustrated without the circuit board 220 and the three-dimensional heat flow structure 230. The housing 210 comprises a top surface 212 that may be recessed with respect to one or more walls 214. The recessed top surface 212 is configured to receive a three-dimensional heat flow structure 230 and the circuit board 220, as described in more detail below. The recessed top surface 212 comprises an opening 216 that exposes an upper surface 255 of the power module 245. The electrically conductive leads 256 pass through the opening 216 of the top surface 212 for electrical connection to the circuit board.

Figure 5B:
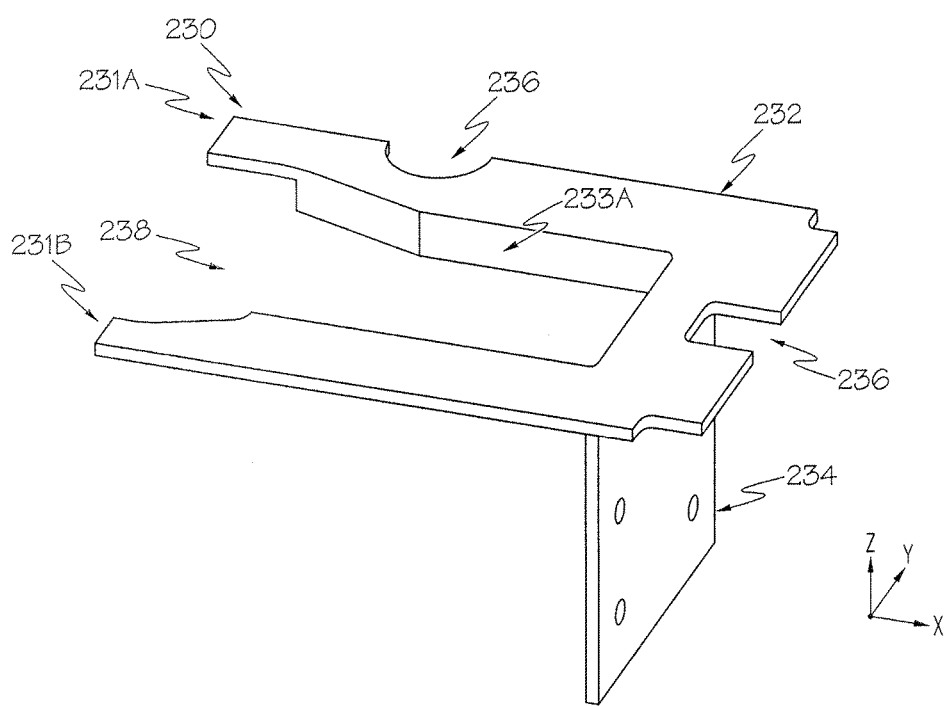

Referring to FIGS. 5A and 5B, an example three-dimensional heat flow structure 230 is schematically illustrated in two perspective views. FIG. 5A is a bottom perspective view of the example three-dimensional heat flow structure 230 and FIG. 5B is a top perspective view of the example three-dimensional heat flow structure 230. The example three-dimensional heat flow structure 230 comprises a first portion 232 arranged in a first plane, and a second portion 234 arranged in a second plane that is transverse to the first plane. Although the first portion 232 and the second portion 234 are illustrated as being planar, embodiments are not limited thereto.

The first portion 232 comprises a convergence region 235, a first arm 231A extending from the convergence region 235, and a second arm 231B extending from the convergence region 235. The first arm 231A is offset from the second arm 231B such that a gap 238 is provided therebetween. The gap 238 provides a region through which the one or more electrically conductive leads 256 of the plurality of second heat generating devices 252 may extend. The first and second arms 231A, 231B may also include first and second walls 233A, 233B that contact an edge of the top surface 212 as well as any other additional features of the housing 210 to provide a greater surface area for thermal transfer between the three-dimensional heat flow structure 230 and the housing 210. The first portion 232 of the three-dimensional heat flow structure 230 may include one or more notches 236 or other features to provide connection to the housing 210.

The second portion 234 of the three-dimensional heat flow structure 230 generally extends from a bottom surface 237B of the first portion 232 at the convergence region 235. In the illustrated embodiment, first portion 232 is parallel to the x-axis and the second portion is parallel to the z-axis such that the second portion 234 is orthogonal to the first portion 232. However, in other embodiments, the second portion 234 may not be orthogonal to the first portion 232. The second portion 234 may take on any shape such that it may thermally contact the cooling device 240, such as at a cold wall of one of the cold plates 243, for example.

It should be understood that the three-dimensional heat flow structure 230 may take on any appropriate shape in accordance with the design parameters of the electronics assembly 200. Accordingly, embodiments described here are not limited to the shape and configuration of the three-dimensional heat flow structures 230 described and illustrated herein.

Figure 6A:
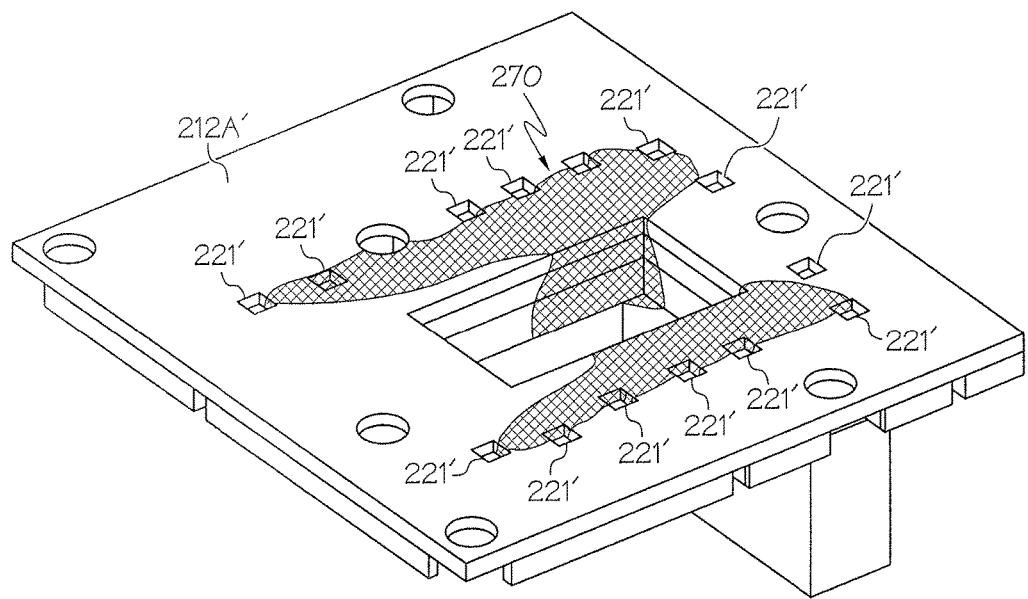
FIGS. 6A and 6B schematically depict
Figure 6B:
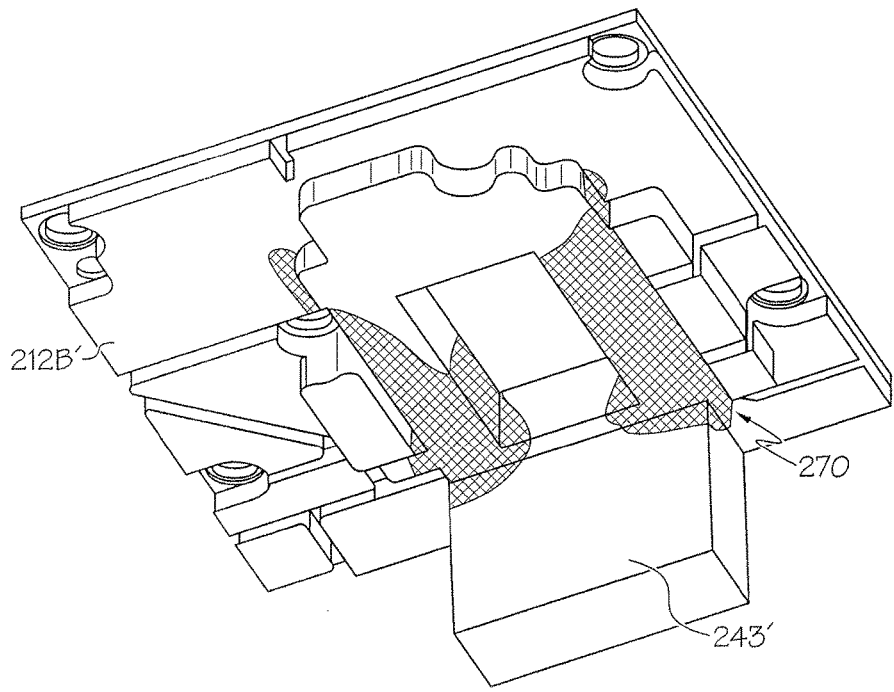

In some embodiments, the shape and configuration of the three-dimensional heat flow structure 230 may be determined by topology optimization, such as by a gradient-based optimization method. Using topology optimization, an ideal shape and configuration of the three-dimensional heat flow structure depending on the design parameters may be realized. FIGS. 6A and 6B schematically depict topology optimization results for a three-dimensional heat flow structure in accordance with the electronics assembly 220 depicted in FIGS. 2 and 3. Area 212A' represents a top surface 212 of the housing 210, area 212B' represents a bottom surface of the housing 210, and area 243' represents cold plates 243 of the cooling device 240 in the topology optimization. Regions 221' represent heat generating devices as described above. Region 270 in FIGS. 6A and 6B represent a non-limiting result of a topology optimization showing an ideal shape and configuration for a three-dimensional heat flow structure that will optimally direct heat flux from regions 221' to area 243'. It is noted that the white regions of FIGS. 6A and 6B have a design density variable of zero, and region 270 has a design density variable of one. FIGS. 5A and 5B schematically depict a resulting synthesized design of a three-dimensional heat flow structure 230 taking manufacturing constraints into consideration.

Figure 7:
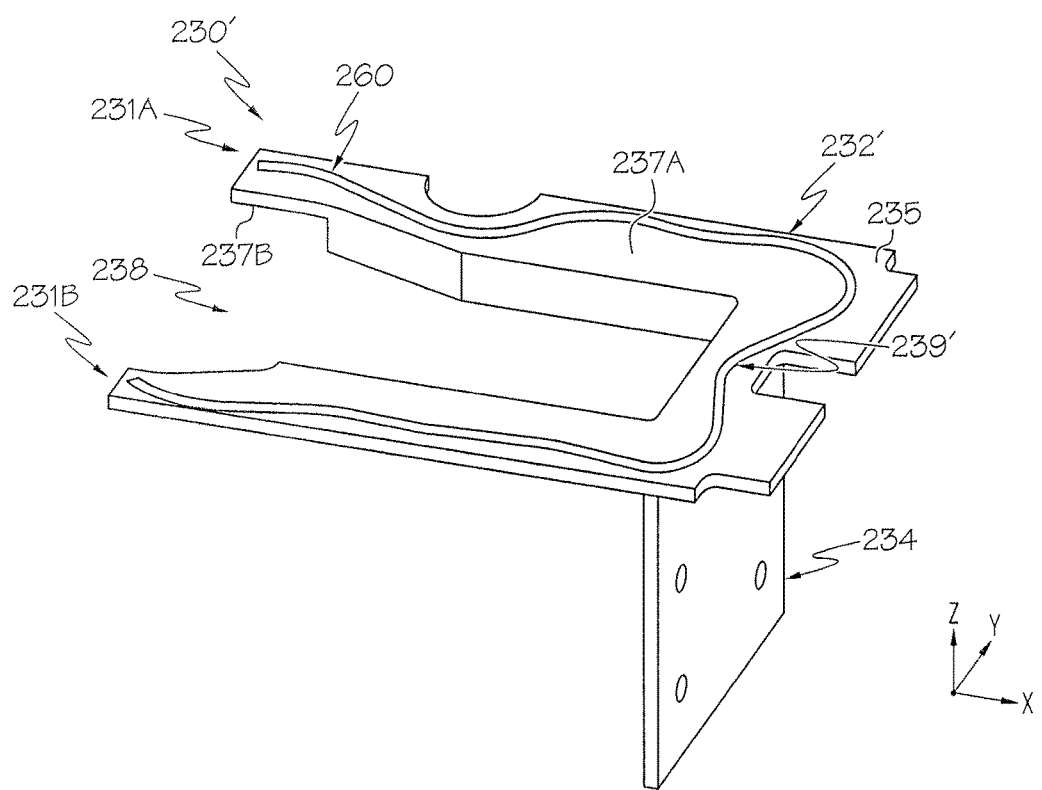
FIG. 7 schematically depicts a perspective view of an example three-dimensional heat flow structure comprising an anisotropic heat flow path according to one or more embodiments described and illustrated herein.

Referring now to FIG. 7, another example three-dimensional heat flow structure 230' is schematically illustrated. The shape of the example three-dimensional heat flow structure 230' is similar to the example three-dimensional heat flow structure 230 depicted in FIGS. 5 and 6. However, the three-dimensional heat flow structure 230' further comprises an anisotropic heat flow path 260 configured to preferentially guide heat flux within the first and second arms 231A, 231B toward a central location 239 of the convergence region 235. Non-limiting examples of anisotropic heat flow structures are described in U.S. Pat. No. 8,516,831. The anisotropic heat flow path 260 may be made of any material or structure capable of providing anisotropic heat flow toward the central location 239 of the convergence region 235. Example anisotropic materials include, but are not limited to graphite, ceramics, and carbon fibers. The anisotropic heat flow path 260 may also be configured as a heat pipe that is embedded in the isotropic heat conductance material of the three-dimensional heat flow structure 230'.

Figure 8:
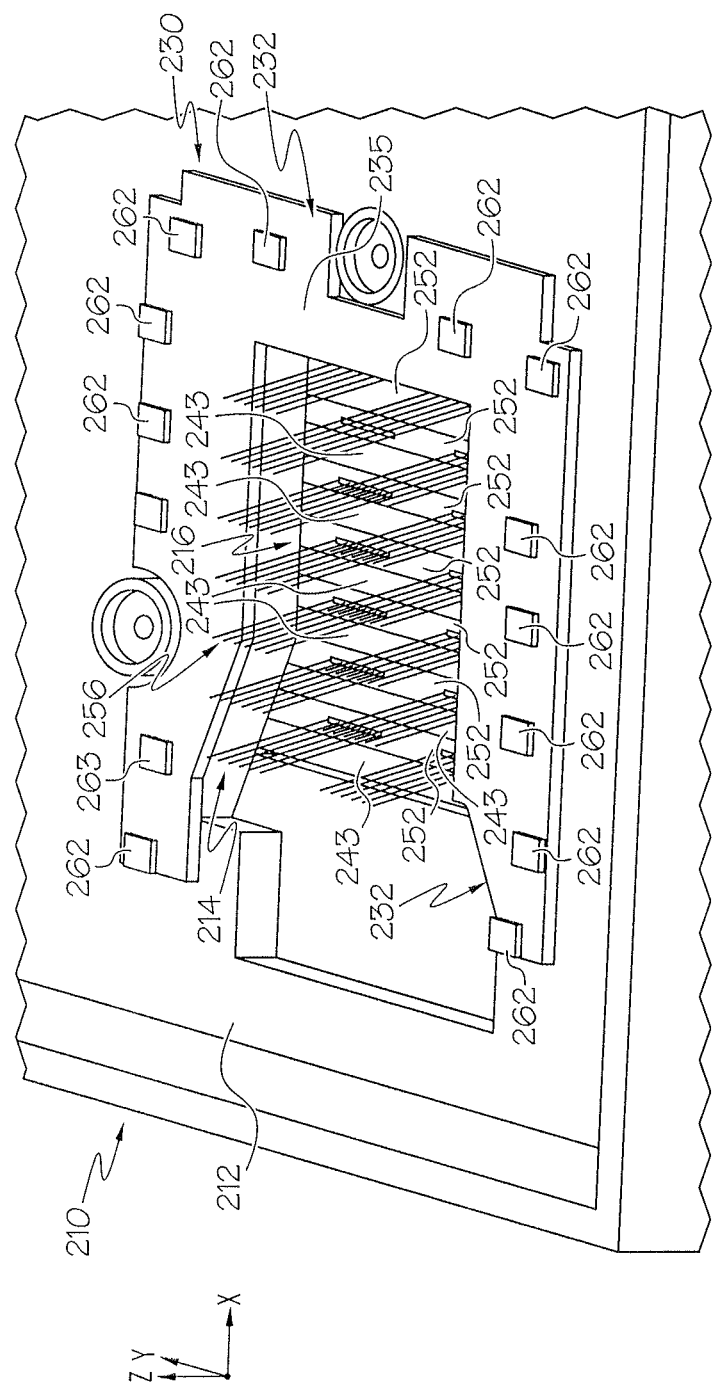
FIG. 8 schematically depicts the example electronics assembly of FIG. 2 with the circuit board removed according to one or more embodiments described and illustrated herein.

FIG. 8 schematically depicts the three-dimensional heat flow structure 230 disposed on the top surface 212 of the housing 210. The bottom surface 237B of the first portion 232 may contact the top surface 212 of the housing 210. The second portion 234 of the three-dimensional heat flow structure 230 extends into the enclosure through the opening 216. The three-dimensional heat flow structure 230 may be coupled to the housing 210 by any appropriate means, such as by fasteners, interference fit, snap fit, and the like. In embodiments, the three-dimensional heat flow structure 230 may be secured to the housing 210 by the attachment of the circuit board 220 to the housing 210 such that the three-dimensional heat flow structure 230 is disposed between the circuit board 220 and the housing 210, as described in more detail below.

The example three-dimensional heat flow structure 230 further includes a plurality of thermally conductive pads 262 disposed on a top surface 237A of the first portion 232. The thermally conductive pads 262 are arranged on the first portion 232 such that the plurality of first heat generating components 222 are disposed on the plurality of thermally conductive pads 262 when the circuit board 220 is positioned on the top surface 212 of the housing 210. The plurality of thermally conductive pads 262 may prevent the plurality of first heat generating components 222 from being shorted to the three-dimensional heat flow structure 230. The thermally conductive pads 262 may be made of any material that is thermally conductive but electrically insulating. A non-limiting example thermally conductive but electrically insulating material is silicone rubber. In other embodiments, the entire (or a significant portion of) top surface 237A of the three-dimensional heat flow structure 230 is coated with a thermal conductive but electrically insulating material.

Referring once again to FIG. 2, the circuit board 220 is secured to the top surface 212 of the housing 210 such that the first portion 232 of the three-dimensional heat flow structure 230 is positioned between the circuit board 220 and the top surface 212 of the housing 210. The circuit board 220 may be secured to the housing 210 by any means, such as by the use of mechanical fasteners, for example. The electrically conductive leads 256 are electrically coupled to the circuit board 220. The first heat generating components 222 are coupled to a bottom surface of the circuit board 220 such that they are thermally coupled to the first portion 232 of the three-dimensional heat flow structure 230. Thermally conductive traces 224 may be disposed on the circuit board 220 to provide additional heat flux removal. Non-limiting examples of thermally conductive traces are described in U.S. Pat. No. 9,433,074. Heat flux generated by the first heat generating components 222 is transferred to the first portion of the three-dimensional heat flow structure 230 and then flows into the second portion 234 where it is then transferred to the cooling device 240.

Figure 9:
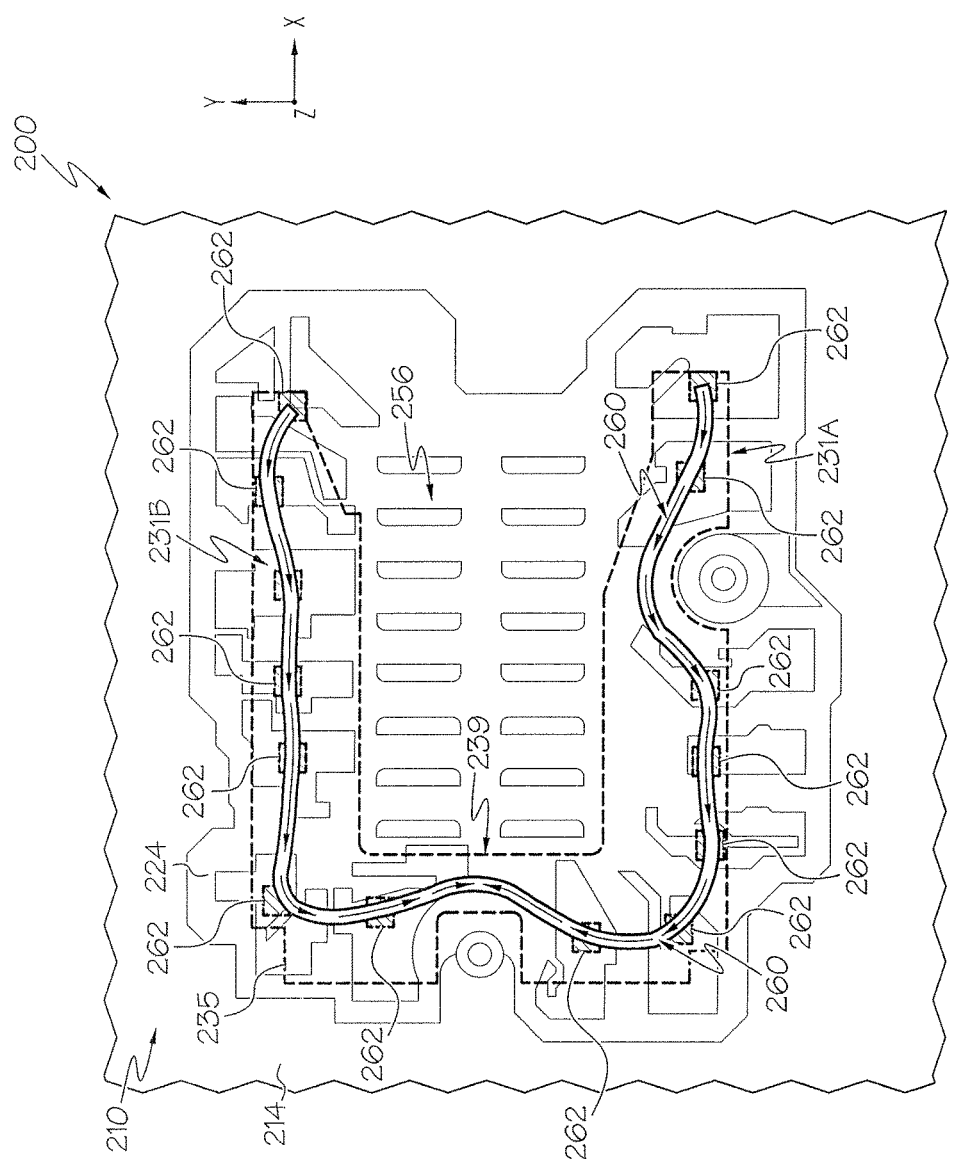
FIG. 9 schematically depicts a top view of the example electronics assembly of FIG. 2 according to one or more embodiments described and illustrated herein.

FIG. 9 is a partial top view of the example electronics assembly 200 with the circuit board 220 disposed on the first portion 232 of the three-dimensional heat flow structure 230' and the top surface 212 of the housing 210. As shown in FIG. 9, the first heat generating devices 222 are aligned with the anisotropic heat flow path 260. Thus, heat flux generated by the first heat generating components 222 is transferred to the anisotropic heat flow path 260 and is guided by the anisotropic heat flow path 260 toward the central location 239 as indicated by the arrows. Heat flux may then travel from the convergence region 235 down into the enclosure through the second portion 234 of the three-dimensional heat flow structure 230. The heat flux is then transferred to the cooling device 240.

Figure 10:
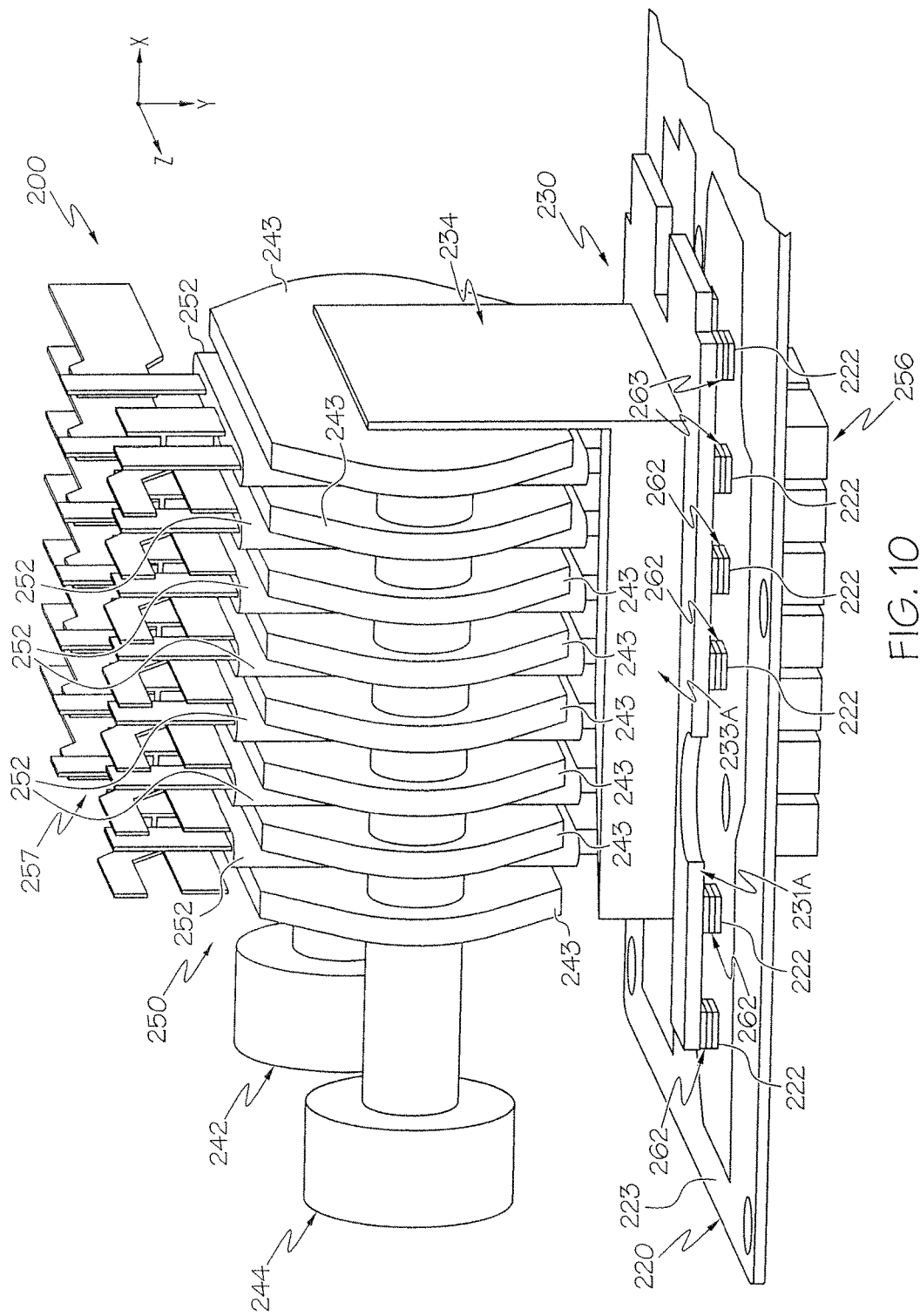
FIG. 10 schematically depicts a perspective view of the example electronics assembly of FIG. 2 with the housing removed according to one or more embodiments described and illustrated herein.

FIG. 10 schematically depicts a bottom, perspective view of the example electronics assembly 200 with the housing 210 removed. The first heat generating components 222 are electrically coupled to a bottom surface 223 of the circuit board 220. The circuit board 220 is disposed on the three-dimensional heat flow structure 230 such that the first heat generating components 222 are aligned with, and thermally coupled to, the thermally conductive pads 262. The second portion 234 of the three-dimensional heat flow structure 230 is thermally coupled to the cooling device 240 at a surface of an outside cold plate 243, for example. The second portion 234 may be thermally coupled to the cooling device 240 by any appropriate method, such as by the use of fasteners, for example. As stated above, heat flux generated by the first heat generating components 222 is removed by the cooling device 240. In this manner, the first heat generating components 222 are thermally coupled to the cooling device 240 by the three-dimensional heat flow structure 230.

Figure 11:
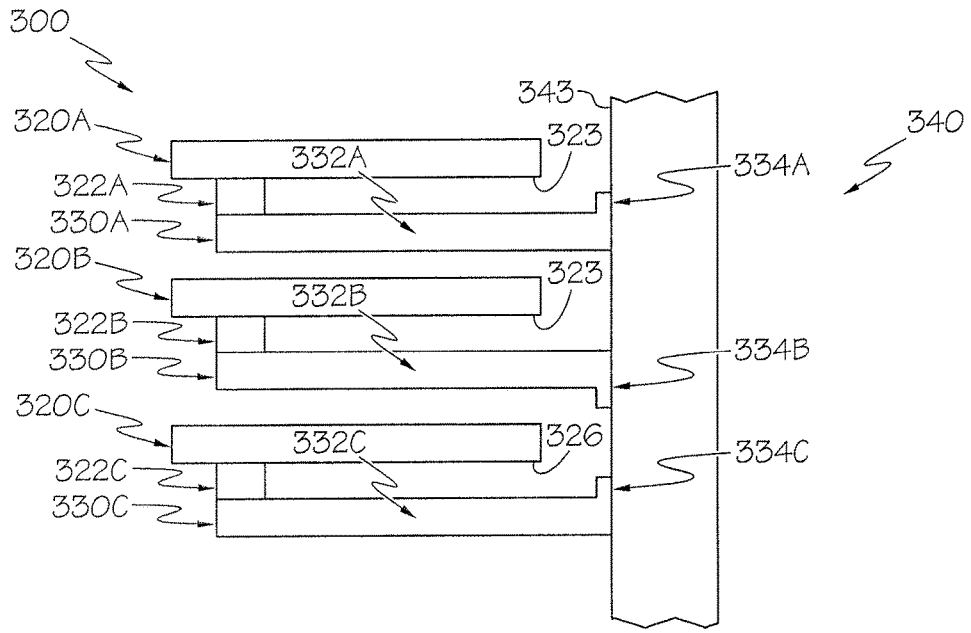
FIG. 11 schematically depicts a side view of another example electronics assembly comprising a plurality of substrates and a plurality of three-dimensional heat flow structures according to one or more embodiments described and illustrated herein.

Embodiments of the three-dimensional heat flow structures described herein may take on other configurations. Referring now to FIG. 11, another example electronics assembly 300 is schematically illustrated. The example electronics assembly 300 includes a cooling device 340 which provides a cold wall 343. As described above, the cooling device 340 may take on any configuration such that it is capable of removing heat flux generated by heat generating components.

In the illustrated embodiment, the electronics assembly 300 comprises a first substrate 320A, a second substrate 320B, and a third substrate 320C. It should be understood that two or more substrates may be provided. One or more heat generating components 322A-322C may be disposed on a surface 323 of the first, second and third substrates 320A-320C, respectively. It should be understood that the one or more heat generating components may be disposed on a top surface, a bottom surface, or both surfaces of the first, second and third substrates 320A-320C. The one or more heat generating components 322A-322C may be any component that generates heat.

The example electronics assembly 300 further comprises a first three-dimensional heat flow structure 330A, a second three-dimensional heat flow structure 330B, and a third three-dimensional heat flow structure 330C. The first three-dimensional heat flow structure 330A comprises a first portion 332A that is thermally coupled to the first heat generating component 322A, and a second portion 334A that is transverse to the first portion 332A and is thermally coupled to the cooling device 340. Similarly, the second three-dimensional heat flow structure 330B comprises a first portion 332B that is thermally coupled to the second heat generating component 322B, and a second portion 334B that is transverse to the first portion 332B and is thermally coupled to the cooling device 340. The third three-dimensional heat flow structure 330C comprises a first portion 332C that is thermally coupled to the third heat generating component 322C, and a second portion 334C that is transverse to the first portion 332C and is thermally coupled to the cooling device 340. In this manner, the first, second and third three-dimensional heat flow structures 330A-330C thermally couple the first, second and third heat generating components 322A-322C to the cooling device 340. It is noted that each three-dimensional heat flow structure 330A-330C may comprise a structurally optimized composite configuration to transport heat in an anisotropic manner between the heat sources and the cooling device.

Other variations are also possible. For example a three-dimensional heat flow structure may be thermally coupled to components on both sides of the substrates. Further, the first, second and third three-dimensional heat flow structures 330A-330C may be provide in an integral, unitary component wherein the second portions 334A-334C are interconnected to one another in a single wall that is then thermally coupled to the cooling device 340.

Figure 12:
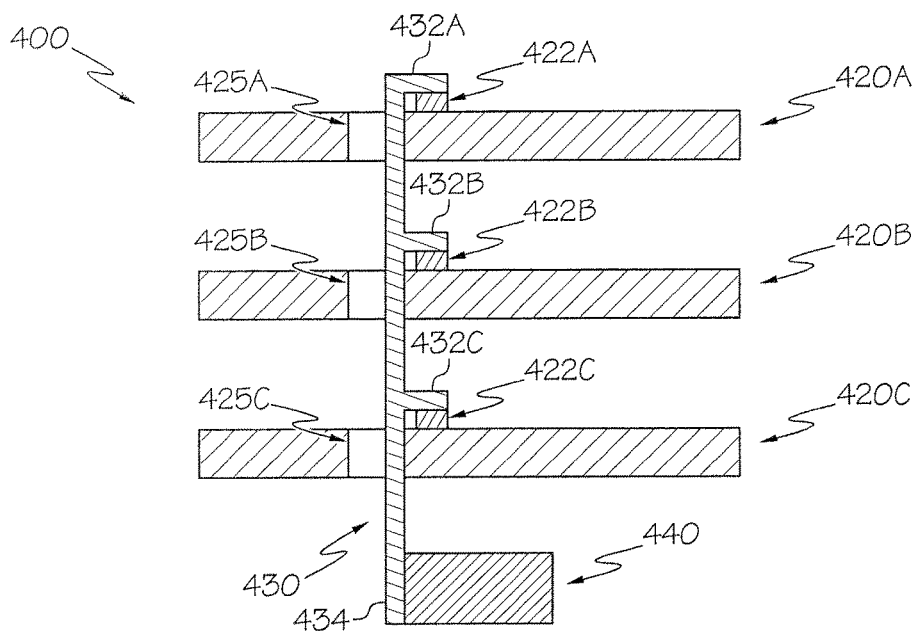
FIG. 12 schematically depicts a side view of another example electronics assembly comprising a plurality of substrates and a plurality of three-dimensional heat flow structures according to one or more embodiments described and illustrated herein.

FIG. 12 schematically illustrates a cross-section of yet another example electronics assembly 400 including a three-dimensional heat flow structure 430. The electronics assembly 400 further includes a stack of substrates in the form of a first substrate 420A, a second substrate 420B, and a third substrate 420C. It should be understood that two or more substrates may be provided in the stack. At least one first heat generating device 422A is coupled to a surface of the first substrate 420A, at least one second heat generating device 422B is coupled to a surface of the second substrate 420B, and at least one third heat generating device 422C is coupled to a surface of the third substrate 420C. The first substrate 420A comprises a first notch 425A, the second substrate 420B comprises a second notch 425B, and the third substrate 420C comprises a third notch 425C.

The three-dimensional heat flow structure 430 comprises a second portion 434 that is disposed through the first, second and third notches 425A-425C of the first, second and third substrates 420A-420C, respectively. The three-dimensional heat flow structure 430 further comprises first portions 432A-432C that extend from the second portion 434 and are thermally coupled to first, second and third heat generating components 422A-422C. Accordingly, the three-dimensional heat flow structure 430 thermally couples the first, second and third heat generating components 422A-422C to the cooling device 440.

It should now be understood that embodiments described herein are directed to electronics assemblies including three-dimensional heat flow structures that thermally couple one or more heat generating components, such as electronic heat generating components, to a cooling device that is outside of a plane to which the heat generating device is coupled. The three-dimensional heat flow structures described herein traverse three-dimensional space to thermally couple heat generating components to a cooling device. In one example, power switching devices are thermally coupled to a dedicated cooling device. One or more gate-drive integrated circuits are electrically coupled to power switching devices but are positioned outside of a plane in which the cooling device and power switching devices are located. The three-dimensional heat flow structures described herein may remove heat flux generated by the gate-drive integrated circuits by thermally coupling the gate-drive integrated circuits to the cooling device through three-dimensional space, thereby lowering the operating temperature of the gate-drive integrated circuits.

The invention claimed is:
1. An electronics assembly comprising:
a substrate comprising a surface defining a plane;
a heat generating component coupled to the surface of the substrate;
a cooling device positioned outside of the plane defined by the surface of the substrate; and
a three-dimensional heat flow structure comprising:
a first portion thermally coupled to the heat generating component, wherein at least a portion of the first portion is parallel to the plane defined by the substrate, and the first portion comprises:
a convergence region;
a first arm extending from the convergence region; and
a second arm extending from the convergence region, wherein the convergence region, the first arm, and the second arm are planar and parallel to the plane defined by the surface of the substrate;
a second portion extending from the convergence region of the first portion and is transverse to the first portion, wherein:
the second portion is transverse to the plane defined by the surface of the substrate; and
the second portion is thermally coupled to the cooling device such that the three-dimensional heat flow structure thermally couples the heat generating component to the cooling device.

2. The electronics assembly of claim 1, wherein the second portion is orthogonal to the first portion.

3. The electronics assembly of claim 1, wherein:
the cooling device comprises a cold plate; and
the second portion of the three-dimensional heat flow structure is thermally coupled to the cold plate.

4. The electronics assembly of claim 1, further comprising at least one additional substrate, each additional substrate comprising a surface and an additional heat generating component, wherein:
the three-dimensional heat flow structure comprises at least one additional first portion coupled to the additional heat generating component of the at least one additional substrate;
the substrate and the at least one additional substrate each comprise a notch; and
the second portion of the three-dimensional heat flow structure is disposed within the notch of the substrate and the at least one additional substrate.

5. The electronics assembly of claim 1, further comprising a second heat generating component, wherein the second heat generating component is directly coupled to the cooling device.

6. The electronics assembly of claim 5, wherein:
the cooling device comprises a first cold plate and a second cold plate;
the second heat generating component is disposed between the first cold plate and the second cold plate.

7. The electronics assembly of claim 5, wherein the heat generating component is operable to control operation of the second heat generating component.

8. The electronics assembly of claim 5, wherein the heat generating component is a gate-drive integrated circuit and the second heat generating component is a power switching device.

9. The electronics assembly of claim 1, wherein the three-dimensional heat flow structure comprises an anisotropic heat flow path having an anisotropic material embedded in the first portion such that heat flows within the first arm and the second arm toward a central location in the convergence region.

10. The electronics assembly of claim 1, further comprising:
a plurality of additional heat generating components coupled to the surface of the substrate and thermally coupled to the three-dimensional heat flow structure; and
a plurality of additional second heat generating components directly coupled to the cooling device.

11. The electronics assembly of claim 1, further comprising:
a second heat generating component, wherein the second heat generating component is directly coupled to the cooling device;
a housing, the housing defining an enclosure and comprising a component surface, wherein:
the component surface comprises an opening;
the cooling device and the second heat generating component are disposed within the enclosure;
the first portion of the three-dimensional heat flow structure is disposed on the component surface of the housing such that the second portion extends through the opening of the component surface;
the second heat generating component comprises at least one electrically conductive lead that extends from the second heat generating component and into the opening;
the surface of the substrate faces the component surface of the housing such that the heat generating component is disposed between the surface of the substrate and the first portion of the three-dimensional heat flow structure; and
the at least one electrically conductive lead is electrically coupled to the substrate.

12. An electronics assembly comprising:
a housing defining an enclosure and comprising a component surface, the component surface comprising an opening;
a substrate comprising a surface defining a plane, wherein the surface of the substrate faces the component surface of the housing;
a heat generating component coupled to the surface of the substrate;
a cooling device positioned outside of the plane defined by the surface of the substrate and disposed within the enclosure; and
a three-dimensional heat flow structure comprising:
a first portion thermally coupled to the heat generating component, the first portion comprising:
a convergence region;
a first arm extending from the convergence region; and
a second arm extending from the convergence region, wherein the convergence region, the first arm, and the second arm are planar and parallel to the plane defined by the surface of the substrate;
a second portion extending from the first portion, wherein:
the second portion is transverse to the first portion;
the second portion extends through the opening of the component surface of the housing; and
the second portion is thermally coupled to the cooling device such that the three-dimensional heat flow structure thermally couples the heat generating component to the cooling device.

13. The electronics assembly of claim 12, wherein the second portion is orthogonal to the first portion.

14. The electronics assembly of claim 12, wherein:
the cooling device comprises a cold plate; and
the second portion of the three-dimensional heat flow structure is thermally coupled to the cold plate.

15. The electronics assembly of claim 12, further comprising a second heat generating component, wherein:
the cooling device comprises a first cold plate and a second cold plate; and
the second heat generating component is disposed between the first cold plate and the second cold plate.

16. The electronics assembly of claim 15, wherein the heat generating component is a gate-drive integrated circuit and the second heat generating component is a power switching device.

17. The electronics assembly of claim 12, wherein the three-dimensional heat flow structure comprises an anisotropic heat flow path comprises an anisotropic material embedded in the first portion such that heat flows within the first arm and the second arm toward a convergence location in the convergence region.

18. The electronics assembly of claim 12, further comprising:

a plurality of additional heat generating components coupled to the surface of the substrate and thermally coupled to the three-dimensional heat flow structure; and a plurality of additional second heat generating components directly coupled to the cooling device.

* * * * *

UNITED STATES PATENT AND TRADEMARK OFFICE
CERTIFICATE OF CORRECTION

PATENT NO. : 10,206,310 B2
APPLICATION NO. : 15/481821
DATED : February 12, 2019
INVENTOR(S) : Hiroshi Ukegawa et al.

It is certified that error appears in the above-identified patent and that said Letters Patent is hereby corrected as shown below:

In the Specification

In Column 4, Line 34 & 35, before "insulated-gate bipolar transistor (IGBT)", delete "a" and insert --an--, therefor.

Signed and Sealed this
Sixteenth Day of April, 2019

Andrei Iancu
*Director of the United States Patent and Trademark Office*